United States Patent [19]
Rupp

[11] Patent Number: 5,821,599
[45] Date of Patent: Oct. 13, 1998

[54] TEMPERATURE SENSOR HAVING A P-N JUNCTION

[75] Inventor: Roland Rupp, Lauf, Germany

[73] Assignee: Siemens Aktiengesellschaft, München, Germany

[21] Appl. No.: 571,867

[22] PCT Filed: Mar. 28, 1994

[86] PCT No.: PCT/DE94/00347

§ 371 Date: Jan. 5, 1996

§ 102(e) Date: Jan. 5, 1996

[87] PCT Pub. No.: WO95/02172

PCT Pub. Date: Jan. 19, 1995

[30] Foreign Application Priority Data

Jul. 7, 1993 [DE] Germany ............ 43 22 650.7

[51] Int. Cl.$^6$ ............ H01L 31/058; H01L 31/0312
[52] U.S. Cl. ............ 257/467; 257/77
[58] Field of Search ............ 257/77, 467

[56] References Cited

U.S. PATENT DOCUMENTS 5,154,514  10/1992  Gambino et al. ............ 374/178
5,252,840  10/1993  Shiomi et al. .
5,264,713  11/1993  Palmour .

OTHER PUBLICATIONS

Patent Abstracts of Japan, vol. 10, No. 145, 28 May 1986 & JP-A-61 006881 (Touhoku Kinzoku Kogyo K.K.), 13 Jan. 1986.
Patent Abstracts of Japan, vol. 7, No. 64, 17 Mar. 1983 & JP-A-57 207834 (Shinnihon Musen K.K.), 20 Dec. 1982.
Patent Abstracts of Japan, vol. 12, No. 228, 28 Jun. 1988 & JP-A-63 019869 (Fujitsu LTD.), 27 Jan. 1988.
Diamond and Related Materials, vol. 1 (1992), pp. 109–120, Elsevier Science Publishers, Amsterdam, NL; Robert F. Davis et al.: *Epitaxial thin film growth, characterization and device development in monocrystalline α–and β–silicon carbide*.

Primary Examiner—Stephen Meier
Attorney, Agent, or Firm—Kenyon & Kenyon

[57] ABSTRACT

A temperature sensor has a doped first semiconductor region having a band gap greater than 2 eV and an oppositely doped second semiconductor region also having a band gap greater than 2 eV. The second semiconductor region is adjacent to the first semiconductor region, forming a p-n junction. A source and a drain electrode are connected to each other through the first semiconductor region. The electrical characteristics of the sensor are affected by temperature. Temperature is measured by applying a specified voltage across the electrodes and measuring the resulting current, or by applying a specified current and measuring the resulting voltage.

22 Claims, 2 Drawing Sheets

TEMPERATURE SENSOR HAVING A P-N JUNCTION

BACKGROUND OF THE INVENTION

The invention relates to temperature sensors, in particular temperature sensors that can be used over a broad range of high temperatures. The electronic properties of semiconductor components, such as the density and mobility of the charge carriers, are generally temperature-dependent. If the intention is to use a component in a broad temperature range, it may be necessary to compensate for the influences of temperature using measurement technology. In order to compensate for temperature, the temperature at the component must be measured by a temperature sensor. This temperature sensor should be disposed as closely as possible to the component and preferably be integrated together with the component on a semiconductor chip. This would keep the thermal contact resistances between the component and the temperature sensor as low as possible.

Known temperature sensors are temperature-dependent resistors (thermistors) and thermal elements. With the aid of thin film technology, both sensor types can be integrated as thin metal films on a semiconductor component. One problem encountered is measuring temperatures in high-temperature and power electronics due to the high temperatures associated with the environments in which they are used. Another common problem is high temperature resulting from thermal power dissipation. For example, at temperatures of about 400° C., the use of known sensor films is restricted because of metallurgical changes in the films. Changes in resistance occur in thermistor films because of granular growth processes, and changes in the contact material occur in the thermal element films because of diffusion processes.

A semiconductor material suitable for high-temperature applications up to at least 800° C. and for high power output is silicon carbide (SiC). SiC is distinguished by a low intrinsic charge carrier density, a high breakdown field strength, a high thermal conductivity, and good thermal and chemical properties. A few components using SiC have already been developed, including a JFET (Junction Field Effect Transistor), MESFET (MEtal Oxide Semiconductor Field Effect Transistor) and a MOSFET (Metal Oxide Semiconductor Field Effect Transistor). Certain electronic properties of the SiC components depend on temperature because temperature affects charge carrier densities and mobilities in the component ("Diamond and Related Materials", vol. I (1992), pp. 109–120, Elsevier Science Publishers, Amsterdam).

An object of the present invention is to provide a temperature sensor that can measure temperatures of at least 400° C. A further object is to monolithically integrate the sensor with a semiconductor component on a substrate. This allows the effect of temperature variations on the component to be controlled and compensated for.

SUMMARY OF THE INVENTION

These objectives are achieved in accordance with the present invention, which provides a temperature sensor having a junction of two oppositely doped semiconductor regions, each with a band gap greater than 2 eV. The two regions meet to form a p-n junction. A source electrode and a drain electrode are connected through the first region. A certain source-drain voltage is applied, and the current signal between these two electrodes is measured. Alternatively, a certain source-drain current is applied, and the voltage signal between these electrodes is measured. The magnitude of the current or voltage signal is related to the size of the space charge region of the p-n junction, which is related to the temperature. Hence, by measuring the current or voltage signal, the temperature may be measured over a range of at least 400° C.

Silicon Carbide is a material that has the proper physical and electrical properties for use as the semiconductor material for the sensor.

The sensor may advantageously be provided with a gate electrode to adjust the measuring sensitivity. Applying a voltage to the gate electrode changes the size of the space charge region, thus adjusting the sensitivity and operating range of the sensor.

The p- and n-doped semiconductor regions may be arranged in the most convenient fashion for any given situation. In one embodiment, one region is formed with a substrate, and the other region is formed as a doped layer at least partially arranged on the substrate. In another embodiment, one region is arranged between a substrate and the second doped region. A plurality of oppositely doped regions can be allocated to the first region, thus forming a corresponding number of p-n junctions. Any embodiment of the present invention can be integrated with a semiconductor component on a substrate.

DETAILED DESCRIPTION

Figure 1:
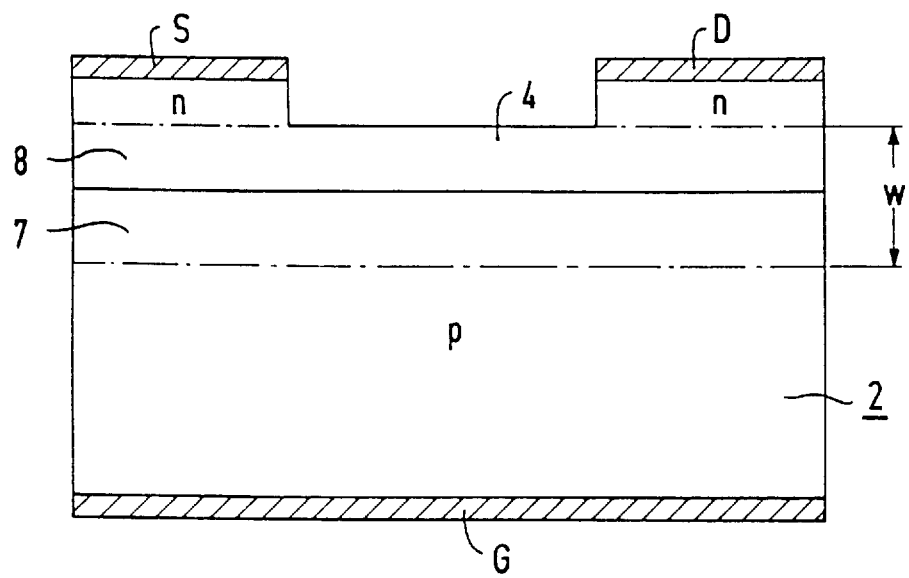
FIG. 1 depicts a temperature sensor having p-n junction and a horizontal channel.

FIG. 1 shows a substrate of a p-conducting semiconductor 2 with a band gap between the valence band and the conduction band of greater than 2 eV. An n-doped region 4 is arranged in or on the substrate 2, and a p-doped region 7 is formed with the substrate 2. A space charge region 8 is formed around p-n junction 11. The n-doped region 4 is at least partially formed as a horizontal channel connecting source electrode S and drain electrode D.

The p-n junction 11 is designed so that its intrinsic space charge region 8 just covers the entire channel at a specified reference temperature $T_{ref}$, which is usually ambient temperature (21° C.). This is achieved by adjusting the built-in diffusion voltage and the donor and acceptor density of the p-n junction 11. At reference temperature $T_{ref}$, the channel blocks the flow of current. Only a negligible leakage current $I_{SD}$ flows between electrodes S and D when a voltage is applied across the electrodes. Of course, the source-drain voltage that is applied must not exceed the breakdown voltage of the p-n junction 11. At higher temperatures of $T > T_{ref}$, the channel opens, allowing increasing source-drain current as the temperature rises. The width w of the space charge region 8 of the p-n junction 11 decreases monotonically as the temperature rises. In this way, the source-drain current $I_{SD}$ is dependent upon the temperature T and can be evaluated as a measuring signal of the temperature sensor.

The source-drain voltage is preferably so adjusted that the source-drain current $I_{SD}$ reaches its saturation current value. The saturation current is defined here as the maximum source-drain current, which does not increase even upon the further increase of the source-drain voltage.

The measuring range of this temperature sensor extends from the reference temperature $T_{ref}$, at which the space charge region 8 just blocks the entire channel, up to a maximum temperature $T_{max}$. At $T_{max}$, the channel is completely open and the source-drain current $I_{SD}$ is at its saturation value. $T_{max}$ also occurs when the p-n junction 11 loses its rectifying characteristic as the result of thermally generated charge carriers.

When the source-drain current $I_{SD}$ is kept constant, the temperature is determined by measuring the change in voltage caused by the change in the current-carrying area in the region 4, in effect measuring the associated change in resistance.

The p-n junction 11 can also be comprised of a p-conducting region 4 and of an n-conducting region 7. Moreover, an additional layer can be arranged as a region 7 between the region 4 and the substrate 2. The p-n junction 11 is then formed by this layer and the region 4.

The size of the space charge region 8 can be controlled by applying a gate voltage to a gate electrode G. This adjusts the measuring sensitivity of the temperature sensor and its operating point. This gate electrode G can be disposed, for example, on the side of the substrate 2 facing away from the side with the source electrode S and the drain electrode D. At least one gate electrode may be provided for each of the other embodiments of the present invention shown in FIGS. 2–4.

The doped regions and the substrate 2 consist in each case of a semiconductor material having a band gap greater than 2 eV and preferably of the same semiconductor material. The present invention is suited for high application temperatures of at least 400° C. because the band gap of the semiconductor is high when compared to that of silicon (1.1 eV). Examples of such semiconductors are diamond, AlN, GaN, or also InN. Due to its excellent thermal and electronic properties, SiC is the most preferred semiconductor. Even at 800° C., the charge carrier density for intrinsic conduction for SiC semiconductor material still lies under the critical value of about $10^{13}$ cm$^{-3}$ at which the channel can no longer adequately block.

Figure 2:
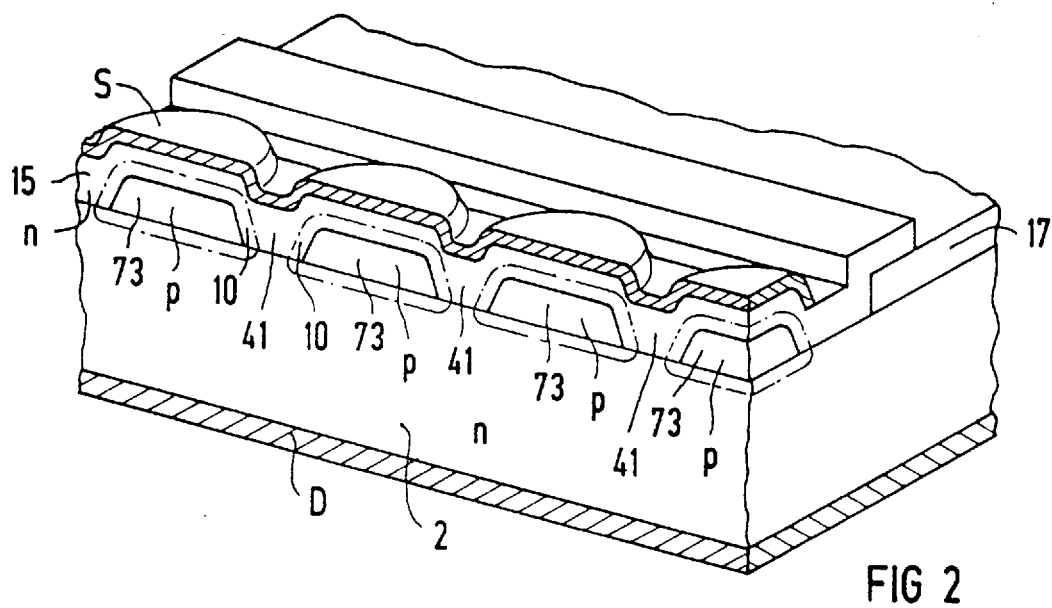
FIG. 2 depicts a cutaway view of a temperature sensor having a plurality of p-n junctions and vertical channels.
Figure 3:
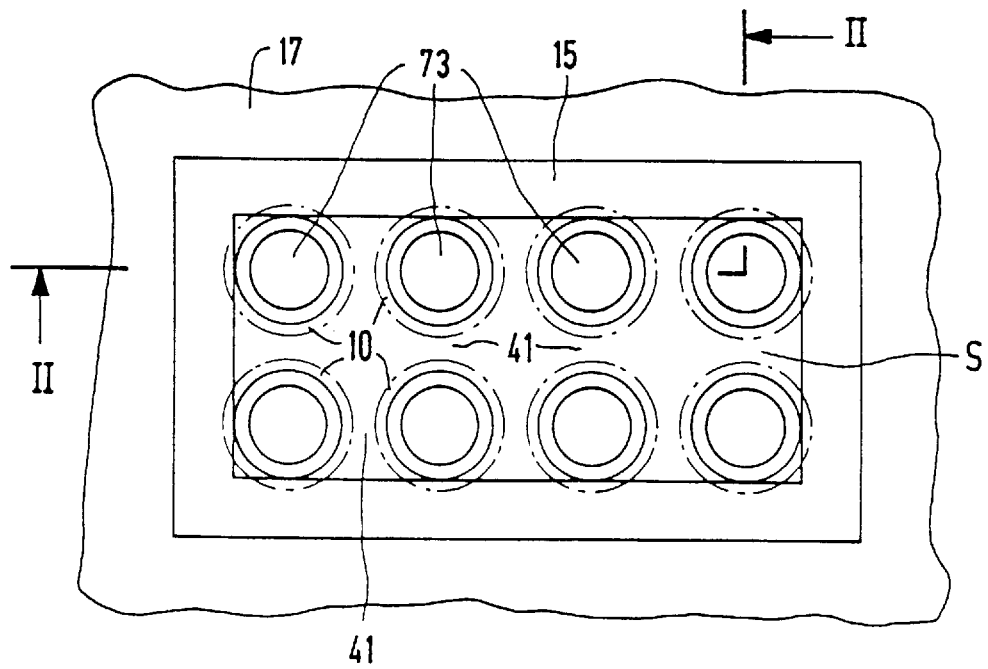
FIG. 3 depicts a top view of a temperature sensor having a plurality of p-n junctions and vertical channels.

In a specific embodiment shown in a cut-away, perspective view in FIG. 2 and in a top view in FIG. 3, a source electrode S is arranged on one side and a drain electrode D on an opposite side of an n-conducting substrate 2. A p-conducting layer 17 is disposed on the substrate 2. Circular p-regions 73 are formed, for example, as mesa-like structures out of this layer 17. An n-conducting layer 15 is disposed over these p-regions 73 and the interposed surface areas of the substrate 2. A patterned layer is arranged as a source electrode S on this n-type layer 15. This layer and the two layers 15 and 17 are preferably grown epitaxially. The p-regions 73 can also be implanted in the form of wells in the substrate 2. The n-type layer 15 and the source electrodes S applied thereto are then essentially planar.

The source electrode S is connected to the drain electrode D via a region 41, which is comprised of the n-conducting substrate 2 and the n-type layer 15 disposed thereupon and is narrowed by the space charge regions 10 of the p-n junctions 11 between the p-regions 73 and the n-type substrate 2 or the n-type layer 15 as a current-carrying channel. It is exactly at a specified reference temperature $T_{ref}$, at which the two space charge regions 10 around adjacent p-regions 73 make contact, that this channel is again blocked. At higher temperatures of $T>T_{ref}$, the space charge regions 10 recede, and a source-drain current $I_{SD}$ flows in the channel that opens up. The flow of this current $I_{SD}$ is directed essentially perpendicularly to the surfaces of the substrate 2 having the electrodes S or D.

In another embodiment, substrate 2 is made of p-conducting semiconductor, as is layer 15. Regions 73 are then n-conducting so as to form p-n junctions 11.

In another embodiment, a gate contact is formed on the exposed surface of the p-type layer 17.

Figure 4:
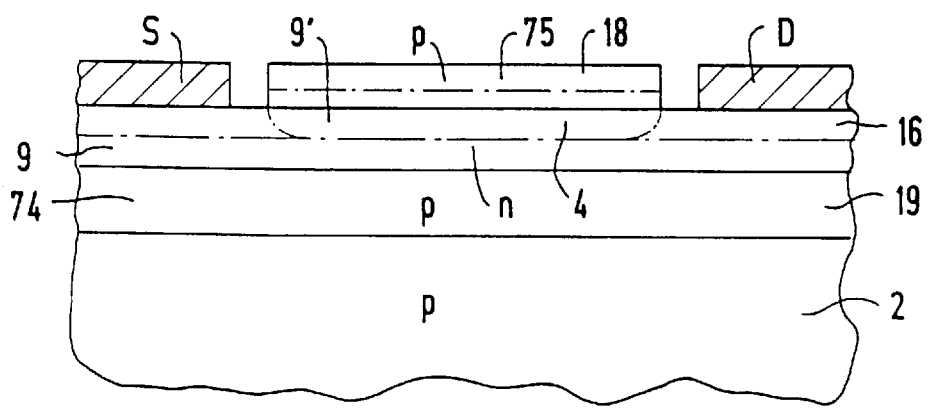
FIG. 4 depicts a temperature sensor having two p-n junctions in cross-section.

FIG. 4 depicts an advantageous specific embodiment of a temperature sensor in cross-section. A p-conducting substrate 2 is provided. An n-conducting layer 16 is arranged on a surface of this substrate 2. Preferably, a p-conducting layer 19 is also provided between the substrate 2 and the n-conducting layer 16. Both layers 16 and 19 can be grown epitaxially. A source electrode S and a drain electrode D are arranged on the n-conducting layer 16. A p-conducting layer 18 is deposited on the n-type layer 16 between the two electrodes S and D. In the case of the n-type layer 16, the region 4 connecting the source electrode S and the drain electrode D is formed as a current-carrying channel. This region 4 is delimited to the top and the bottom, respectively, by the space charge region 9 of the p-n junction 11 situated between a p-region 74 formed by the p-type layer 19 and the n-region 4 and by the space charge region 9' of the p-n junction 11 situated between a p-region 75 formed by the p-type layer 18 and the n-type region 4. In the depicted specific embodiment, the two space charge regions 9 and 9' make contact, so that at the appropriate reference temperature $T_{ref}$, the channel is again blocked. The source-drain current $I_{SD}$ is now dependent again upon the temperature $T>T_{ref}$.

In other embodiments, the doping can be reversed, so that n-conducting regions become p-conducting regions and vice versa. The doped regions can be made of different semiconductor materials or of the same semiconductor material.

The temperature sensor is preferably integrated with the component on a semiconductor substrate to compensate for temperature, particularly in SiC semiconductor applications involving high power or high-temperatures. The semiconductor substrate can even consist of Si when the substrate only has a supporting function for the temperature sensor and when the doped regions required for the p-n junction 11 of the sensor are not formed from the substrate of the component. In such a case, the individual process steps for fabricating the temperature sensor are still compatible with the process steps for the component, and the process achieves a very good thermal coupling of the temperature sensor and of the component.

I claim:
1. A temperature sensor comprising:
 a) a doped first semiconductor region having a band gap greater than 2 eV;
 b) a second semiconductor region having a band gap greater than 2 eV and a doping opposite to that of said first semiconductor region, said second semiconductor region adjacent to said first semiconductor region, forming a p-n junction;
 c) a source electrode adjacent to said first semiconductor region; and
 d) a drain electrode separate from said source electrode, said drain electrode adjacent to said first semiconductor region and connected to said source electrode by a channel within said first semiconductor region, said channel being normally off at a reference temperature, whereby a temperature is measured in accordance with a change in a current/voltage characteristic in response to a change of temperature.

2. The temperature sensor of claim 1 wherein when a specified source-drain voltage is applied a source-drain current is detected as a measuring signal representative of a temperature to be measured.

3. The temperature sensor of claim 1 wherein when a specified source-drain current is applied a source-drain voltage is detected as a measuring signal representative of a temperature to be measured.

4. The temperature sensor of claim 1, wherein said first semiconductor region is p-doped and said second semiconductor region is n-doped.

5. The temperature sensor of claim 1, wherein said first semiconductor region is n-doped and said second semiconductor region is p-doped.

6. The temperature sensor of claim 1, wherein said first semiconductor region is silicon carbide.

7. The temperature sensor of claim 6, further comprising a gate electrode for adjusting measuring sensitivity.

8. The temperature sensor of claim 6, further comprising a substrate and a semiconductor component whose temperature is to me measured, said temperature sensor integrated with the said semiconductor component on said substrate.

9. The temperature sensor of claim 6, further comprising a substrate, wherein said substrate comprises said second semiconductor region, and said first semiconductor region is formed as a doped layer at least partially arranged on said substrate.

10. The temperature sensor of claim 1, wherein said second semiconductor region is silicon carbide.

11. The temperature sensor of claim 10, further comprising a gate electrode for adjusting measuring sensitivity.

12. The temperature sensor of claim 10 further comprising a substrate, wherein said substrate comprises said second semiconductor region, and said first semiconductor region is formed as a doped layer at least partially arranged on said substrate.

13. The temperature sensor of claim 10, further comprising a substrate and a semiconductor component whose temperature is to be measured, said temperature sensor integrated with the semiconductor component of the substrate.

14. The temperature sensor of claim 1, further comprising a gate electrode for adjusting measuring sensitivity.

15. The temperature sensor of claim 14, further comprising a substrate, wherein said substrate comprises said second semiconductor region, and said first semiconductor region is formed as a doped layer at least partially arranged on said substrate.

16. The temperature sensor of claim 14, further comprising a substrate and a semiconductor component whose temperature is to be measured, said temperature sensor integrated with the semiconductor component of the substrate.

17. The temperature sensor of claim 1, further comprising a substrate, wherein said substrate comprises said, second semiconductor region, and said first semiconductor region is formed as a doped layer at least partially arranged on said substrate.

18. The temperature sensor of claim 17, wherein said second semiconductor region is arranged between said substrate and said first semiconductor region.

19. The temperature sensor of claim 11, further comprising a plurality regions doped oppositely to said first semiconductor region, said first semiconductor region arranged in between said second region and said plurality of oppositely doped regions, forming a corresponding number of p-n junctions.

20. The temperature sensor of claim 1, further comprising a substrate and a semiconductor component whose temperature is to be measured, said temperature sensor integrated with the semiconductor component of the substrate.

21. A temperature sensor for measuring a temperature, comprising:
 a) a doped first semiconductor region having a band gap greater than 2 eV;
 b) a second semiconductor region having a band gap greater than 2 eV and a doping opposite to that of said first semiconductor region, said second semiconductor region adjacent to said first semiconductor region, forming a p-n junction;
 c) a source electrode adjacent to said first semiconductor region; and
 d) a drain electrode separate from said source electrode, said drain electrode adjacent to said first semiconductor region and connected to said source electrode by a channel within said first semiconductor region, said channel being off at a reference temperature, and said channel opening at a first temperature higher than the reference temperature, the temperature being measured in accordance with a change in a current/voltage characteristic in response to a change of temperature.

22. The sensor according to claim 21, wherein the temperature sensor has a temperature measuring range of the first reference temperature up to a maximum reference temperature, said channel being fully on at the maximum reference temperature.

* * * * *